(12) United States Patent
Ji et al.

(10) Patent No.: US 8,988,932 B2
(45) Date of Patent: Mar. 24, 2015

(54) TIME PROCESSING METHOD AND CIRCUIT FOR SYNCHRONOUS SRAM

(71) Applicant: Huawei Technologies Co., Ltd., Shenzhen (CN)

(72) Inventors: Bingwu Ji, Shenzhen (CN); Yunming Zhou, Shenzhen (CN); Tanfu Zhao, Shenzhen (CN); Wei Lin, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 34 days.

(21) Appl. No.: 14/057,863

(22) Filed: Oct. 18, 2013

(65) Prior Publication Data
US 2014/0043889 A1    Feb. 13, 2014

Related U.S. Application Data

(63) Continuation of application No. PCT/CN2011/072911, filed on Apr. 18, 2011.

(51) Int. Cl.
| | |
|---|---|
| *G11C 11/00* | (2006.01) |
| *G11C 11/413* | (2006.01) |
| *G11C 11/419* | (2006.01) |
| *G11C 8/18* | (2006.01) |
| *G11C 11/418* | (2006.01) |
| *G11C 11/41* | (2006.01) |

(52) U.S. Cl.
CPC .............. *G11C 11/413* (2013.01); *G11C 11/41* (2013.01); *G11C 11/419* (2013.01); *G11C 8/18* (2013.01); *G11C 11/418* (2013.01)
USPC .......................... 365/154; 365/205; 365/233.1

(58) Field of Classification Search
USPC ........................................ 365/154, 205, 233.1
See application file for complete search history.

(56) References Cited

U.S. PATENT DOCUMENTS

| | | | |
|---|---|---|---|
| 5,808,959 | A | 9/1998 | Kengeri et al. |
| 2010/0246309 | A1 | 9/2010 | Shimono et al. |
| 2011/0242912 | A1* | 10/2011 | Kang et al. ............... 365/194 |

FOREIGN PATENT DOCUMENTS

CN        1606096 A        4/2005

OTHER PUBLICATIONS

Foreign Communication From a Counterpart Application, PCT Application No. PCT/CN2011/072911, English Translation of Search Report dated Jan. 19, 2012, 4 pages.
Foreign Communication From a Counterpart Application, PCT Application No. PCT/CN2011/072911, English Translation of Written Opinion dated Jan. 19, 2012, 4 pages.

* cited by examiner

*Primary Examiner* — Hoai V Ho
(74) *Attorney, Agent, or Firm* — Conley Rose, P.C.; Grant Rodolph; Nicholas K. Beaulieu

(57) ABSTRACT

A timing processing method and a circuit for a synchronous SRAM are provided. The method includes: directly inputting an address signal to a wordline decoder for logic decoding; generating various signals by setting various devices in terms of timing; and performing sensitive amplification on data that is input by a memory cell array and is selected by a bitline, and then outputting the data, that is, generating a data output signal. The circuit for a synchronous SRAM includes: a wordline decoder, a timing generator, a wordline controller, a wordline pulse width generator, a memory cell array, and a sense amplifier.

15 Claims, 4 Drawing Sheets

TIME PROCESSING METHOD AND CIRCUIT FOR SYNCHRONOUS SRAM

CROSS-REFERENCE TO RELATED APPLICATION

This application is a continuation of International Application No. PCT/CN2011/072911, filed on Apr. 18, 2011, which is hereby incorporated by reference in its entirety.

STATEMENT REGARDING FEDERALLY SPONSORED RESEARCH OR DEVELOPMENT

Not applicable.

REFERENCE TO A MICROFICHE APPENDIX

Not applicable.

TECHNICAL FIELD

Embodiments of the present invention relate to the field of electronic technologies, and in particular to a timing processing method and a circuit for a synchronous static random accessible memory (SRAM).

BACKGROUND

An SRAM can save data, which is stored in the static random accessible memory, without a need of refreshing a circuit. Therefore, it is greatly helpful to improve system performance. SRAMs are used by a Level 1 cache and a Level 2 cache in a central processing unit (CPU). To further improve CPU performance, timing paths of the CPU need to be reduced and an external Level 1 SRAM cache or Level 2 SRAM cache with low capacity needs to be integrated. However, as one of the critical timing paths, an SRAM timing path limits improvement of a working frequency of the CPU. At a high level, SRAMs may be classified into two types: synchronous type and asynchronous type. A synchronous SRAM adopts one input clock to start all data processing (such as reading, writing, and deselecting). An asynchronous SRAM, however, does not have clock input and must monitor input to acquire a command from a controller. Upon identifying a certain command, the asynchronous SRAM immediately executes it.

A synchronous SRAM commonly used at present is shown in an electrical schematic diagram in FIG. 1. One timing path of the synchronous SRAM is described in the following with reference to FIG. 1. An address latch 101 latches an input clock signal, and when certain setup time and hold time between the clock signal and an address signal are satisfied, the address latch 101 outputs an internal address signal; a wordline decoder 102 performs logic decoding on the internal address signal; and a sense amplifier 103 is connected to a bitline and an anti-bit line, and amplifies, when a voltage difference between the bitline and the anti-bit line rises to a certain range, data input by a memory cell array 104, and outputs the amplified data.

During implementation of the present invention, the inventor of the present invention finds the prior art has at least the following defects: in an existing synchronous SRAM, an address latch latches an address signal first; for the latch, certain setup time and hold time need to be satisfied before an internal address signal is output; and after being latched, an address is transmitted to an address decoder for address decoding. The address latching performed by the address latch consumes a certain amount of time, which increases running time of a timing path of the synchronous SRAM, thereby reducing a working speed of the synchronous SRAM.

SUMMARY

Embodiments of the present invention provide a timing processing method and a circuit for a synchronous SRAM, which can improve a working speed of the synchronous SRAM and enable the synchronous SRAM to work at a higher frequency.

An embodiment of the present invention provides a timing processing method for a synchronous SRAM, where the method includes: directly inputting an address signal to a wordline decoder for logic decoding; inputting a clock to a timing generator to generate a wordline clock signal, and inputting the wordline clock signal to a wordline controller to generate a wordline gating control signal; inputting, under the control of the wordline gating control signal, a result of the logic decoding performed by the wordline decoder, that is, a wordline decoding signal, to a wordline pulse width generator to generate a wordline signal, so as to complete a wordline startup procedure; inputting the wordline signal to a memory cell array, where during wordline startup, data saved by the memory cell array is output to a bitline, selected by the bitline, and then input to a sense amplifier; generating, by the timing generator, a sense amplifier control signal after a preset period of time since the wordline signal is generated, and outputting the sense amplifier control signal to the sense amplifier to start a sensitive amplification procedure; and generating, by the sense amplifier, a sensitive amplification finished signal and a data output signal, where the sensitive amplification finished signal is configured to be input to the timing generator to shut down the wordline clock signal, so as to control shutdown of the wordline gating control signal and finally control shutdown of the wordline signal; and the data output signal includes data that is output after the sense amplifier performs sensitive amplification on the data that is input by the memory cell array and is selected by the bitline.

An embodiment of the present invention provides a circuit of a synchronous SRAM, where the circuit includes: a wordline decoder, a timing generator, a wordline controller, a wordline pulse width generator, a memory cell array, and a sense amplifier, where: the wordline decoder is configured to directly perform logic decoding on an input address signal; the timing generator is configured to generate a wordline clock signal and a sense amplifier control signal when a clock is input; the wordline controller is configured to generate a wordline gating control signal when the wordline clock signal is input; the wordline pulse width generator is configured to generate a wordline signal when the wordline gating control signal and a result of the logic decoding performed by the wordline decoder, that is, a wordline decoding signal, are input; the memory cell array is configured to output saved data to a bitline after the wordline signal is input, and output data that is selected by the bitline to the sense amplifier; and the sense amplifier is configured to amplify data input by the memory cell array and generate a data output signal when the sense amplifier control signal is input, and feed back a sensitive amplification finished signal to the timing generator, where the sensitive amplification finished signal is configured to be input to the timing generator to shut down the wordline clock signal, so as to control shutdown of the wordline gating control signal and finally control shutdown of the wordline signal; and the data output signal includes data that is output after the sense amplifier performs sensitive amplification on the data that is input by the memory cell array and is selected by the bitline.

It can be seen from the preceding technical solutions that, the embodiments of the present invention have the following advantages: in the embodiments of the present invention, an address signal is directly input to a wordline decoder for logic decoding, which saves a latching time of an address latch on a timing path; in addition, various signals are generated by setting various devices in terms of timing; and in this way, data that is input by a memory cell array and is selected by a bitline is output after sensitive amplification, that is, a data output signal is generated, and a whole timing processing procedure of a synchronous SRAM is completed, so that a working speed of the synchronous SRAM can be improved and the synchronous SRAM is enabled to work at a higher frequency.

DETAILED DESCRIPTION

Embodiments of the present invention provide a timing processing method and a circuit for a synchronous SRAM, which can improve a working speed of the synchronous SRAM and enable the synchronous SRAM to work at a higher frequency.

To make the objectives, characteristics, and advantages of the present invention more comprehensible, the technical solutions in the embodiments of the present invention are clearly described in the following with reference to the accompanying drawings in the embodiments of the present invention. Apparently, the embodiments to be described are merely a part rather than all of the embodiments of the present invention. All other embodiments obtained by persons skilled in the art based on the embodiments of the present invention shall fall within the protection scope of the present invention.

Figure 1:
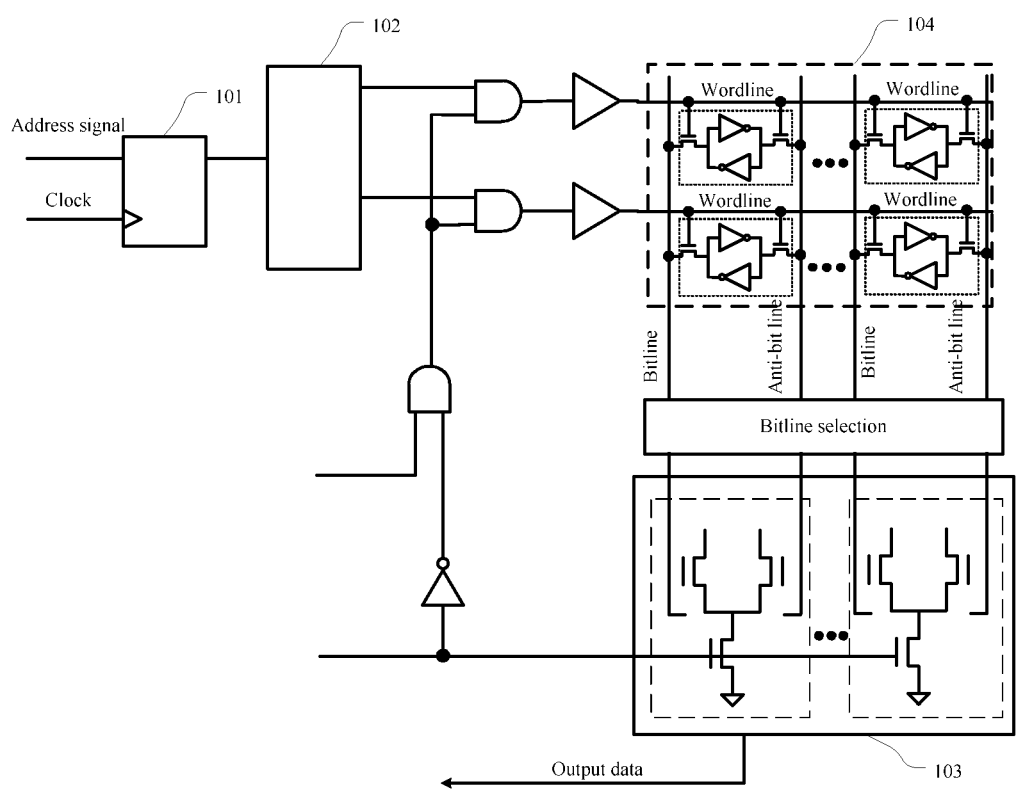
FIG. 1 is a circuit diagram of a commonly used synchronous SRAM.
Figure 2:
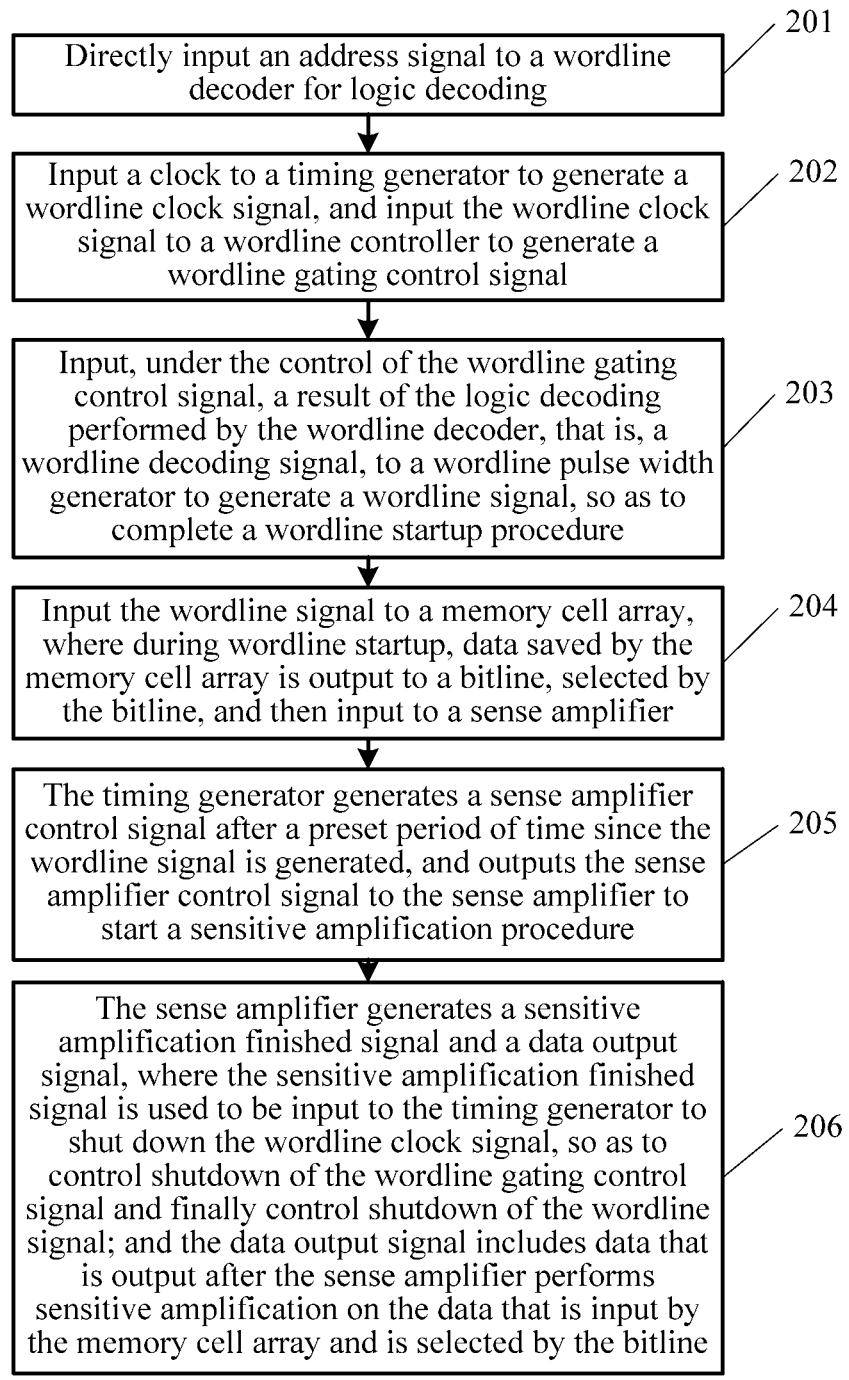
FIG. 2 is a schematic diagram of timing processing of a synchronous SRAM according to an embodiment of the present invention.

FIG. 2 is a schematic diagram of timing processing of a synchronous SRAM according to an embodiment of the present invention.

201. Directly input an address signal to a wordline decoder for logic decoding.

In this embodiment of the present invention, an address signal is directly input to a wordline decoder without being latched by an address latch, which can reduce a latch delay on a timing path.

202. Input a clock to a timing generator to generate a wordline clock signal, and input the wordline clock signal to a wordline controller to generate a wordline gating control signal.

203. Input, under the control of the wordline gating control signal, a result of the logic decoding performed by the wordline decoder, that is, a wordline decoding signal, to a wordline pulse width generator to generate a wordline signal, so as to complete a wordline startup procedure.

204. Input the wordline signal to a memory cell array, where during wordline startup, data saved by the memory cell array is output to a bitline, selected by the bitline, and then input to a sense amplifier.

205. The timing generator generates a sense amplifier control signal after a preset period of time since the wordline signal is generated, and outputs the sense amplifier control signal to the sense amplifier to start a sensitive amplification procedure.

In this embodiment of the present invention, after a preset period of time since the wordline signal is generated, a sense amplifier control signal is generated to control startup of the sense amplifier, where the preset period of time may be set manually, and may also be generated automatically according to timing logic, which is not limited herein.

206. The sense amplifier generates a sensitive amplification finished signal and a data output signal, where the sensitive amplification finished signal is used to be input to the timing generator to shut down the wordline clock signal, so as to control shutdown of the wordline gating control signal and finally control shutdown of the wordline signal; and the data output signal includes data that is output after the sense amplifier performs sensitive amplification on the data that is input by the memory cell array and is selected by the bitline.

It should be noted that in this embodiment of the present invention, another preferred manner is as follows: a wordline gating control signal and a wordline decoding signal are generated at the same time; and in this case, after the wordline gating control signal and the wordline decoding signal are generated at the same time, the wordline gating control signal and the wordline decoding signal may be input to a wordline pulse width generator to generate a wordline signal, thereby ensuring a highest working speed of the synchronous SRAM. For details, reference may be made to a description in a subsequent embodiment.

In this embodiment of the present invention, an address signal is directly input to a wordline decoder for logic decoding, which saves a latching time of an address latch on a timing path; in addition, various signals are generated by setting various devices in terms of timing; and in this way, data that is input by a memory cell array and is selected by a bitline is output after sensitive amplification, that is, a data output signal is generated, and a whole timing processing procedure of a synchronous SRAM is completed, so that a working speed of the synchronous SRAM can be improved and the synchronous SRAM is enabled to work at a higher frequency.

Figure 3:
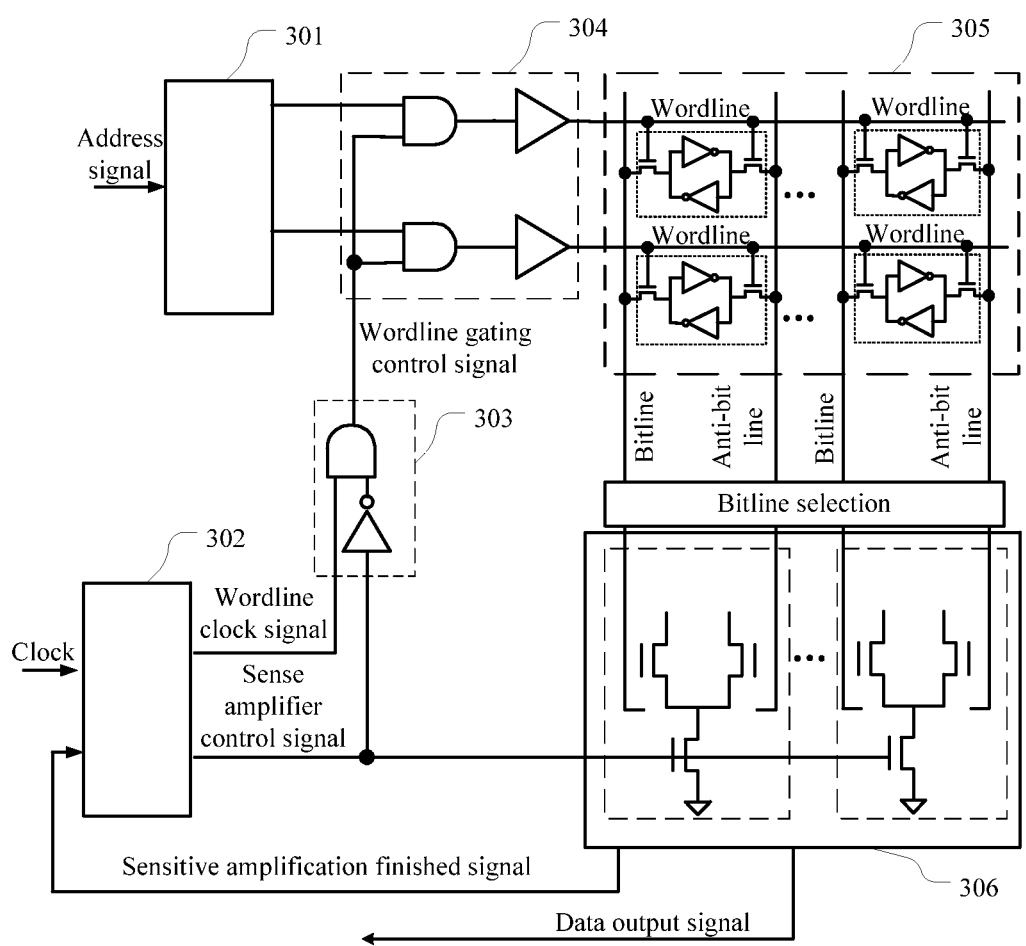
FIG. 3 is a circuit diagram of a synchronous SRAM according to an embodiment of the present invention.

An embodiment of the present invention further provides a circuit for a synchronous SRAM, as shown in a circuit diagram in FIG. 3, where 301 indicates a wordline decoder, 302 indicates a timing generator, 303 indicates a wordline controller, 304 indicates a wordline pulse width generator, 305 indicates a memory cell array, and 306 indicates a sense amplifier. As shown in FIG. 3, a generated address signal (address) of the synchronous SRAM directly enters the wordline decoder 301; the wordline decoder 301 performs logic decoding on the address signal to generate a wordline decoding signal; a clock signal (clock) enters the timing generator 302 to generate a wordline clock signal (clock wordline); the wordline clock signal is input to the wordline controller 303 to generate a wordline gating control signal; and the wordline gating control signal is input to the wordline pulse width generator 304 to generate a wordline signal. In this case, a wordline startup procedure is completed, thereby controlling turn-on of the memory cell array 305. After the memory cell array 305 is turned on, a bit voltage divergence signal on a bitline may accumulate a certain bitline voltage difference (bitline split); after a preset period of time since the wordline signal is generated, the timing generator 302 generates a sense amplifier control signal and inputs the sense amplifier control signal to the sense amplifier 306; then the sense amplifier 306 starts to work under the control of the sense amplifier control signal (clock sensor); and after a period of time, sampling of read data is completed, and the sense amplifier 306 feeds back a sensitive amplification finished signal (sensor finished) in response to the wordline clock signal and outputs a data output signal.

It should be noted that the memory cell array 305 shown in FIG. 3 includes multiple cell arrays. However, this is only one scenario in a practical application. The number of cell arrays included in the memory cell array is not limited herein.

An embodiment of the present invention further provides a timing calculation method based on timing processing of a synchronous SRAM shown in FIG. 2. To clearly describe setup time $t_s$ and hold time $t_h$ of a clock signal, reference is made to FIG. 4. The detailed description is as follows: $t_1$ indicates a period of time from when an address signal is generated to when a wordline decoder generates a decoding signal; $t_2$ indicates a period of time from when a clock is input to a timing generator to when a wordline clock signal is generated; $t_3$ indicates a period of time from when the wordline clock signal is input to a wordline controller to when a wordline gating control signal is generated; $t_4$ indicates a period of time from when the wordline gating control signal is input to a wordline pulse width generator to when a wordline signal is generated; $t_5$ indicates a period of time from when the wordline signal is generated to when the timing generator generates a sense amplifier control signal; $t_6$ indicates a period of time from when the sense amplifier control signal is input to a sense amplifier to when a sensitive amplification finished signal is generated; $t_7$ indicates a period of time from when the sensitive amplification finished signal is fed back to the timing generator to when the wordline clock signal is shut down; $t_8$ indicates a period of time from when the wordline clock signal is shut down to when the wordline gating control signal is controlled to be shut down; and $t_9$ indicates a period of time used for logic decoding performed by the wordline decoder on the address signal.

Figure 4:
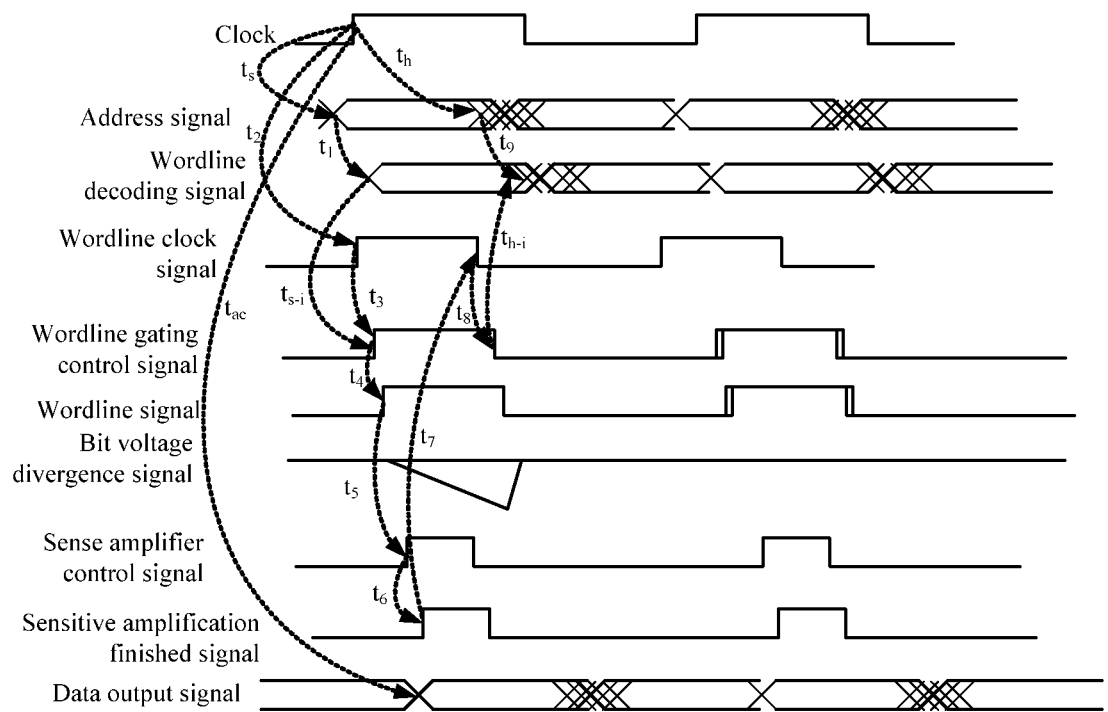
FIG. 4 is an oscillogram of timing processing of a synchronous SRAM according to an embodiment of the present invention.

It can be seen from FIG. 4 that, setup time $t_s$ of the address signal satisfies the following relation:

$$t_s+t_1+t_{s-i}=t_2+t_3.$$

As shown in FIG. 4, $t_{s-i}$ indicates a time interval between the wordline decoding signal and the wordline gating control signal, and $t_{s-i} \geq 0$. The address signal is not latched by an address latch. Therefore, the wordline decoding signal and the wordline gating control signal may be synchronous, and $t_{s-i}$ may be set to a minimum value 0. In this case, the following relation may be obtained:

$$t_s=t_2+t_3-t_1.$$

Hold time $t_h$ of the address signal satisfies the following relation:

$$t_2+t_3+t_4+t_5+t_6+t_7+t_8=t_h+t_9+t_{h-i}.$$

As shown in FIG. 4, $t_{h-i}$ indicates a time interval between the wordline decoding signal and the wordline gating control signal, and $t_{h-i} \geq 0$. The address signal is not latched by an address latch. Therefore, the wordline decoding signal and the wordline gating control signal may be synchronous, and $t_{h-i}$ may be set to a minimum value 0. In this case, the following relation may be obtained:

$$t_h=t_2+t_3+t_4+t_5+t_6+t_7+t_8-t_9.$$

It can be seen from the preceding embodiment that, compared with the prior art, no address latch is involved in this embodiment of the present invention. Therefore, an address signal does not need to be latched by an address latch first; instead, the address signal directly enters a wordline decoder for logic decoding, which reduces a latch delay on a timing path. In addition, various signals are generated by setting various devices in terms of timing; and in this way, data that is input by a memory cell array and is selected by a bitline is output after sensitive amplification, that is, a data output signal is generated, and a whole timing processing procedure of a synchronous SRAM is completed, so that a working speed of the synchronous SRAM can be improved and the synchronous SRAM is enabled to work at a higher frequency.

An embodiment of the present invention further provides a method for calculating a working frequency $f_{sram}$ of a synchronous SRAM. The method is as follows: $f_{sram}=1/t_{cyc}$ and $t_{cyc}=t_s+t_{ac}$, where $t_{ac}$ indicates a period of time from when a clock is generated to when a sense amplifier generates a data output signal. It can be seen from the formula that, one latch delay is reduced in access time $t_{ac}$ under the same condition. In this way, a conclusion that the working frequency $f_{sram}$ is improved can be obtained more evidently.

The timing processing method and the circuit for a synchronous SRAM provided in the embodiments are described in detail in the preceding. Specific examples are used for describing principles and implementation manners of the present invention. The preceding description about the embodiments is merely for help understanding the methods and core ideas of the present invention. Meanwhile, persons skilled in the art may make modifications to the specific implementation manners and application scopes according to the ideas of the present invention. In conclusion, the content of this specification should not be construed as a limitation on the present invention.

What is claimed is:

1. A timing processing method for a synchronous static random accessible memory (SRAM), comprising:
   directly inputting an address signal to a wordline decoder for logic decoding;
   inputting a clock signal to a timing generator to generate a wordline clock signal;
   inputting the wordline clock signal to a wordline controller to generate a wordline gating control signal;
   inputting, under the control of the wordline gating control signal, a result of the logic decoding performed by the wordline decoder by inputting a wordline decoding signal to a wordline pulse width generator to generate a wordline signal to complete a wordline startup procedure;
   inputting the wordline signal to a memory cell array, wherein during wordline startup, data saved by the memory cell array is output to a bitline, selected by the bitline, and then input to a sense amplifier;
   generating, by the timing generator, a sense amplifier control signal after a preset period of time since the wordline signal is generated;
   outputting the sense amplifier control signal to the sense amplifier to start a sensitive amplification procedure; and
   generating, by the sense amplifier, a sensitive amplification finished signal and a data output signal, wherein the sensitive amplification finished signal is configured to be input to the timing generator to shut down the wordline clock signal to control shutdown of the wordline gating control signal and finally control shutdown of the wordline signal, and wherein the data output signal comprises data that is output after the sense amplifier performs sensitive amplification on the data that is input by the memory cell array and is selected by the bitline.

2. The timing processing method for the synchronous SRAM according to claim 1, wherein the wordline gating control signal and the wordline decoding signal are generated at a same time.

3. The timing processing method for the synchronous SRAM according to claim 1, wherein a period of time from when the address signal is generated to when the wordline decoder outputs the wordline decoding signal is $t_1$, wherein a period of time from when the clock is input to the timing generator to when the wordline clock signal is generated is $t_2$, wherein a period of time from when the wordline clock signal is input to the wordline controller to when the wordline gating control signal is generated is $t_3$, wherein a setup time of the address signal is $t_s$, and wherein $t_s$ satisfies the following relation, $t_s=t_2+t_3-t_1$.

4. The timing processing method for the synchronous SRAM according to claim 3, wherein a period of time from when the wordline gating control signal is input to the wordline pulse width generator to when the wordline signal is generated is $t_4$, wherein a period of time from when the wordline signal is generated to when the timing generator generates the sense amplifier control signal is $t_5$, wherein a period of time from when the sense amplifier control signal is input to the sense amplifier to when the sensitive amplification finished signal is generated is $t_6$, wherein a period of time from when the sensitive amplification finished signal is fed back to the timing generator to when the wordline clock signal is shut down is $t_7$, wherein a period of time from when the wordline clock signal is shut down to when the wordline gating control signal is controlled to be shut down is $t_8$, wherein a period of time used for logic decoding performed by the wordline decoder on the address signal is $t_9$, wherein a hold time of the address signal is $t_h$, and wherein $t_h$ satisfies the following relation, $t_h=t_2+t_3+t_4+t_5+t_6+t_7+t_8-t_9$.

5. The timing processing method for the synchronous SRAM according to claim 4, wherein a working frequency of the synchronous SRAM is $f_{sram}$, wherein $f_{sram}=1/t_{cyc}$, wherein $t_{cyc}=t_s+t_{ac}$, and wherein $t_{ac}$ indicates a period of time from when the clock is generated to when the sense amplifier generates the data output signal.

6. A circuit for a synchronous static random accessible memory (SRAM), comprising:
   a wordline decoder,
   a timing generator,
   a wordline controller coupled to the timing generator;
   a wordline pulse width generator coupled to the wordline decoder and the wordline controller;
   a memory cell array coupled to the wordline pulse width generator; and
   a sense amplifier coupled to the memory cell array,
   wherein the wordline decoder is configured to directly perform logic decoding on an input address signal,
   wherein the timing generator is configured to generate a wordline clock signal and a sense amplifier control signal when a clock signal is input,
   wherein the wordline controller is configured to generate a wordline gating control signal when the wordline clock signal is input,
   wherein the wordline pulse width generator is configured to generate a wordline signal when the wordline gating control signal and a result of the logic decoding performed by the wordline decoder are input,
   wherein the memory cell array is configured to output saved data to a bitline after the wordline signal is input and output data that is selected by the bitline to the sense amplifier,
   wherein the sense amplifier is configured to amplify data input by the memory cell array and generate a data output signal when the sense amplifier control signal is input and feed back a sensitive amplification finished signal to the timing generator,
   wherein the sensitive amplification finished signal is configured to be input to the timing generator to shut down the wordline clock signal to control shutdown of the wordline gating control signal and finally control shutdown of the wordline signal, and
   wherein the data output signal comprises data that is output after the sense amplifier performs sensitive amplification on the data that is input by the memory cell array and is selected by the bitline.

7. The circuit for the synchronous SRAM according to claim 6, wherein the wordline gating control signal and the wordline decoding signal are generated at a same time.

8. The circuit for the synchronous SRAM according to claim 6, wherein a period of time from when the address signal is generated to when the wordline decoder outputs the wordline decoding signal is $t_1$, wherein a period of time from when the clock is input to the timing generator to when the wordline clock signal is generated is $t_2$, wherein a period of time from when the wordline clock signal is input to the wordline controller to when the wordline gating control signal is generated is $t_3$, wherein a setup time of the address signal is $t_s$, and wherein $t_s$ satisfies the following relation, $t_s=t_2+t_3-t_1$.

9. The circuit for the synchronous SRAM according to claim 8, wherein a period of time from when the wordline gating control signal is input to the wordline pulse width generator to when the wordline signal is generated is $t_4$, wherein a period of time from when the wordline signal is generated to when the timing generator generates the sense amplifier control signal is $t_5$, wherein a period of time from when the sense amplifier control signal is input to the sense amplifier to when the sensitive amplification finished signal is generated is $t_6$, wherein a period of time from when the sensitive amplification finished signal is fed back to the timing generator to when the wordline clock signal is shut down is $t_7$, wherein a period of time from when the wordline clock signal is shut down to when the wordline gating control signal is controlled to be shut down is $t_8$, wherein a period of time used for logic decoding performed by the wordline decoder on the address signal is $t_9$, wherein a hold time of the address signal is $t_h$, and wherein $t_h$ satisfies the following relation, $t_h=t_2+t_3+t_4+t_5+t_6+t_7+t_8-t_9$.

10. The circuit for the synchronous SRAM according to claim 9, wherein a working frequency of the synchronous SRAM is $f_{sram}$, wherein $f_{sram}=1/t_{cyc}$, wherein $t_{cyc}=t_s+t_{ac}$, and wherein $t_{ac}$ indicates a period of time from when the clock is generated to when the sense amplifier generates the data output signal.

11. A computer program product comprising a non-transitory computer readable storage medium storing program code thereon for application management, the program code comprising instructions for executing a method that comprises:
   directly inputting an address signal to a wordline decoder for logic decoding;
   inputting a clock signal to a timing generator to generate a wordline clock signal;

inputting the wordline clock signal to a wordline controller to generate a wordline gating control signal;

inputting, under the control of the wordline gating control signal, a result of the logic decoding performed by the wordline decoder by inputting a wordline decoding signal to a wordline pulse width generator to generate a wordline signal to complete a wordline startup procedure;

inputting the wordline signal to a memory cell array, wherein during wordline startup, data saved by the memory cell array is output to a bitline, selected by the bitline, and then input to a sense amplifier;

generating, by the timing generator, a sense amplifier control signal after a preset period of time since the wordline signal is generated;

outputting the sense amplifier control signal to the sense amplifier to start a sensitive amplification procedure; and generating, by the sense amplifier, a sensitive amplification finished signal and a data output signal, wherein the sensitive amplification finished signal is configured to be input to the timing generator to shut down the wordline clock signal to control shutdown of the wordline gating control signal and finally control shutdown of the wordline signal, and wherein the data output signal comprises data that is output after the sense amplifier performs sensitive amplification on the data that is input by the memory cell array and is selected by the bitline.

12. The computer program product of claim 11, wherein the wordline gating control signal and the wordline decoding signal are generated at a same time.

13. The computer program product of claim 11, wherein a period of time from when the address signal is generated to when the wordline decoder outputs the wordline decoding signal is $t_1$, wherein a period of time from when the clock is input to the timing generator to when the wordline clock signal is generated is $t_2$, wherein a period of time from when the wordline clock signal is input to the wordline controller to when the wordline gating control signal is generated is $t_3$, wherein a setup time of the address signal is $t_s$, and wherein $t_s$ satisfies the following relation, $t_s = t_2 + t_3 - t_1$.

14. The computer program product of claim 13, wherein a period of time from when the wordline gating control signal is input to the wordline pulse width generator to when the wordline signal is generated is $t_4$, wherein a period of time from when the wordline signal is generated to when the timing generator generates the sense amplifier control signal is $t_5$, wherein a period of time from when the sense amplifier control signal is input to the sense amplifier to when the sensitive amplification finished signal is generated is $t_6$, wherein a period of time from when the sensitive amplification finished signal is fed back to the timing generator to when the wordline clock signal is shut down is $t_7$, wherein a period of time from when the wordline clock signal is shut down to when the wordline gating control signal is controlled to be shut down is $t_8$, wherein a period of time used for logic decoding performed by the wordline decoder on the address signal is $t_9$, wherein a hold time of the address signal is $t_h$, and wherein $t_h$ satisfies the following relation, $t_h = t_2 + t_3 + t_4 + t_5 + t_6 + t_7 + t_8 - t_9$.

15. The computer program product of claim 14, wherein a working frequency of the synchronous SRAM is $f_{sram}$, wherein $f_{sram} = 1/t_{cyc}$, wherein $t_{cyc} = t_s + t_{ac}$, and wherein $t_{ac}$ indicates a period of time from when the clock is generated to when the sense amplifier generates the data output signal.

* * * * *